United States Patent
Asada et al.

(10) Patent No.: US 8,749,977 B2
(45) Date of Patent: Jun. 10, 2014

(54) POWER SEMICONDUCTOR MODULE AND ITS ATTACHMENT STRUCTURE

(75) Inventors: Shinsuke Asada, Chiyoda-ku (JP);
Yuetsu Watanabe, Chiyoda-ku (JP);
Yoshihito Asao, Chiyoda-ku (JP);
Kenjiro Nagao, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 160 days.

(21) Appl. No.: 13/204,226

(22) Filed: Aug. 5, 2011

(65) Prior Publication Data
US 2012/0236503 A1 Sep. 20, 2012

(30) Foreign Application Priority Data
Mar. 17, 2011 (JP) .................................. 2011-59259

(51) Int. Cl.
*H05K 7/20* (2006.01)
*H01L 23/10* (2006.01)

(52) U.S. Cl.
USPC ........... 361/707; 361/715; 361/717; 257/706; 257/707

(58) Field of Classification Search
None
See application file for complete search history.

(56) References Cited

U.S. PATENT DOCUMENTS

| | | | | |
|---|---|---|---|---|
| 5,521,437 A | * | 5/1996 | Oshima et al. | 257/701 |
| 5,781,412 A | * | 7/1998 | de Sorgo | 361/704 |
| 6,841,866 B2 | * | 1/2005 | Arai et al. | 257/702 |
| 6,873,042 B2 | * | 3/2005 | Ishii et al. | 257/702 |
| 7,122,890 B2 | * | 10/2006 | Grant | 257/698 |
| 7,709,947 B2 | * | 5/2010 | Ishikawa | 257/692 |
| 7,892,893 B2 | * | 2/2011 | Obara | 438/112 |
| 8,030,749 B2 | * | 10/2011 | Soyano et al. | 257/688 |
| 8,125,080 B2 | * | 2/2012 | Lee | 257/724 |
| 2004/0017656 A1 | | 1/2004 | Lee et al. | |
| 2005/0104168 A1 | | 5/2005 | Choi et al. | |
| 2005/0161785 A1 | | 7/2005 | Kawashima et al. | |
| 2007/0097651 A1 | * | 5/2007 | Canale et al. | 361/704 |
| 2007/0295496 A1 | * | 12/2007 | Hall et al. | 165/185 |

FOREIGN PATENT DOCUMENTS

JP 4540084 B2 9/2010

OTHER PUBLICATIONS

European Search Report issued Apr. 4, 2013 in Patent Application No. EP 11 17 7061.

* cited by examiner

*Primary Examiner* — Boris Chervinsky
(74) *Attorney, Agent, or Firm* — Sughrue Mion, PLLC

(57) ABSTRACT

A power semiconductor module includes: a first metal substrate on which a power semiconductor device is mounted; a second metal substrate on which a power semiconductor device is not mounted; and an electrically insulating resin package which seals the first metal substrate and the second metal substrate. The back surface of the first metal substrate on the side opposite to the mounting surface of the power semiconductor device is made to expose outside the resin package to form a heat dissipation surface.

14 Claims, 5 Drawing Sheets

POWER SEMICONDUCTOR MODULE AND ITS ATTACHMENT STRUCTURE

BACKGROUND OF THE INVENTION

1. Field of the Invention

The present invention relates to power semiconductor modules and, more particularly, relates to a power semiconductor module and its attachment structure, each of which constitutes one used by being incorporated in a vehicular rotary electric machine, for example, a relay circuit and an inverter circuit for use in a rotary electric machine for a vehicular electric power steering system.

2. Description of the Related Art

As a conventional power semiconductor module, for example, one disclosed in Japanese Patent Gazette No. 4540884 (Patent Document 1) may be used. In such a module, a plurality of semiconductor devices are directly arranged on a conductive heat dissipation substrate and these are integrally formed in a resin package by transfer mold molding together with a plurality of external connection electrodes electrically connected to the semiconductor devices.

A resin package on the surface side opposite to the surface of the heat dissipation substrate on which the plurality of the semiconductor devices are arranged is thin; the heat emitted from the semiconductor devices passes through the heat dissipation substrate and then further passes through the thin resin package to be dissipated to a heat sink attached outside the power semiconductor module. Incidentally, the power semiconductor module and the heat sink are bonded via heat dissipating adhesive or the like.

PRIOR ART DOCUMENT

Patent Document

[Patent Document 1] Japanese Patent Gazette No. 4540884

PROBLEMS TO BE SOLVED BY THE INVENTION

However, in the thus configured power semiconductor module, the heat emitted from the semiconductor devices passes through the resin package whose thermal conductivity is low; and therefore, a problem exists in that heat dissipation properties are not good. A power semiconductor device such as a metal oxide semiconductor field effect transistor (MOSFET) has power loss such as energization loss and switching loss, and the loss is converted to heat. If heat dissipation properties are not good, the heat is not efficiently discharged to the outside; and accordingly, the temperature of the power semiconductor device excessively increases, the power semiconductor device itself and its bonding member are damaged, and failure of the module and degradation of life span are caused. Therefore, the heat dissipation properties are one of important performances required for the power semiconductor module. More particularly, the power semiconductor module to be incorporated in a vehicular rotary electric machine whose mounting space is constrained is often required that the power semiconductor module is small size and a heat dissipation area is constrained; and therefore, the problem of the heat dissipation properties is significant.

In order to improve heat dissipation properties, the structure of a module in which a heat dissipation substrate is made to expose from a resin package to be directly bonded to a heat sink via heat dissipating adhesive is conceivable. In such a structure, the resin package whose thermal conductivity is low does not intervene in a heat dissipation path; and therefore, heat dissipation properties improve. However, at the same time, a plurality of different conductive heat dissipation substrates are exposed to the heat dissipation surface of the module; and accordingly, in the case where a conductive foreign object such as waste metal is attached across between the heat dissipation substrates during a manufacturing process, a problem exists in that short circuit failure of a circuit is caused.

SUMMARY OF THE INVENTION

The present invention has been made to solve the foregoing problem and is to provide a power semiconductor module and its attachment structure, each of which is excellent in heat dissipation properties even in a small size, and short circuit failure is prevented.

Means for Solving the Problems

According to the present invention, there is provided a power semiconductor module including: a first metal substrate on which a power semiconductor device is mounted; a second metal substrate on which a power semiconductor device is not mounted; and an electrically insulating resin package which seals the first metal substrate and the second metal substrate. In the power semiconductor module, the back surface of the first metal substrate on the side opposite to the mounting surface of the power semiconductor device is made to expose outside the resin package to form a heat dissipation surface.

Furthermore, there is provided an attachment structure of a power semiconductor module in which the heat dissipation surface of the power semiconductor module is attached to a base surface formed on a heat sink via an electrically insulating bonding member.

Advantageous Effect of the Invention

According to a power semiconductor module of the present invention, among a plurality of metal substrates, at least a metal substrate on which a power semiconductor device is mounted has the back surface on the side opposite to the mounting surface of the power semiconductor device, the back surface being exposed to the heat dissipation surface of a resin package, and the majority of other metal substrates is embedded in the resin package; and therefore, high heat dissipation properties can be obtained. Furthermore, as a result, an increase of a heat dissipation area for improving heat dissipation properties is suppressed; and therefore, the power semiconductor module can be reduced in size. Furthermore, metal substrates other than that serve as internal wirings or the like and a need of heat dissipation is low and therefore protected by being embedded in the insulating resin package. Accordingly, a risk that causes short circuit failure can be reduced, the short circuit failure being caused by a conductive foreign object attached across between the metal substrates during a process in which the power semiconductor module is assembled to a heat sink. If all the metal substrates are exposed to the heat dissipation surface, the distance between the metal substrates needs to be enlarged in order to reduce the aforementioned risk; however, according to the present invention, there is no need for it and therefore the power semiconductor module can be reduced in size.

The foregoing and other objects, features, aspects and advantages of the present invention will become more apparent from the following detailed description of the present invention when taken in conjunction with the accompanying drawings.

DETAILED DESCRIPTION OF THE INVENTION

Mode for Carrying out the Invention

Figure 1:
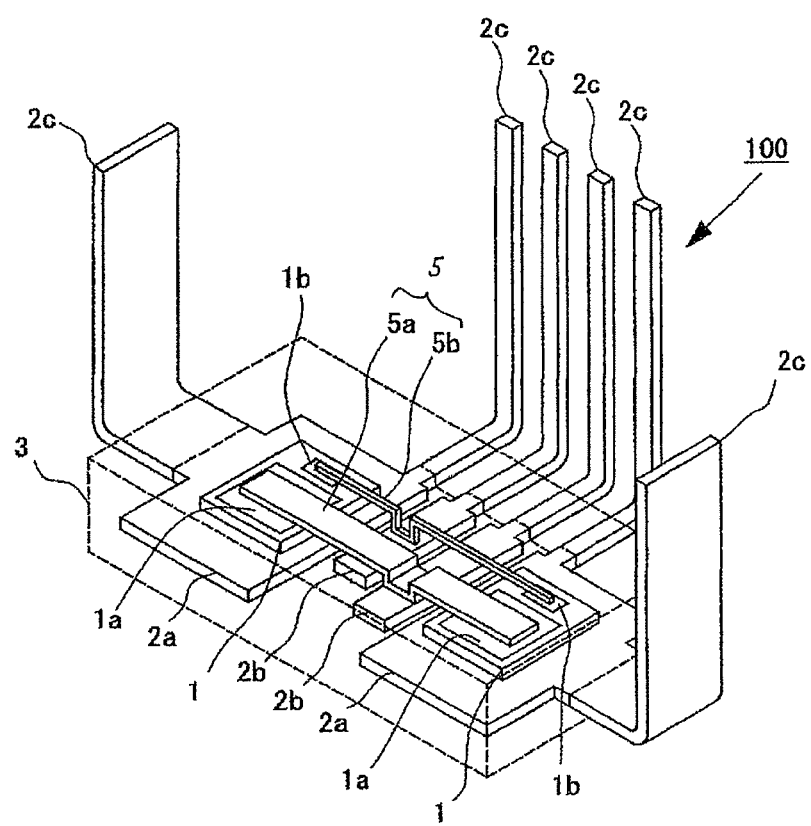
FIG. 1 is a perspective view showing the configuration of a power semiconductor module 100 in Embodiment 1 of the present invention.

A power semiconductor module of the present invention is not one which limits internal circuit configuration; however, as an example, a power semiconductor module having a relay circuit using a metal oxide semiconductor field effect transistor (MOSFET) will be described in the following embodiments.

Hereinafter, respective embodiments of the present invention will be described with reference to drawings.

Incidentally, the same reference numerals as those shown in the respective drawings represent the same or corresponding elements.

Embodiment 1

Hereinafter, Embodiment 1 of the present invention will be described with reference to FIGS. 1 to 4.

First, a power semiconductor module 100 will be described.

Figure 2:
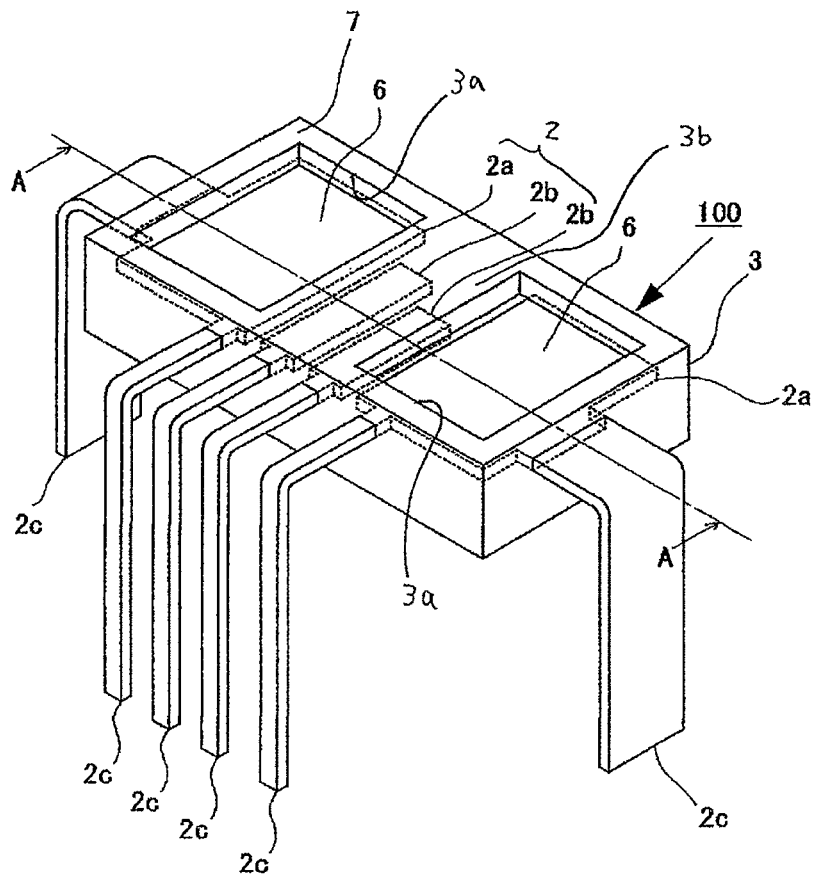
FIG. 2 is a perspective view in which the power semiconductor module 100 in Embodiment 1 of the present invention is seen from another angle.
Figure 3:
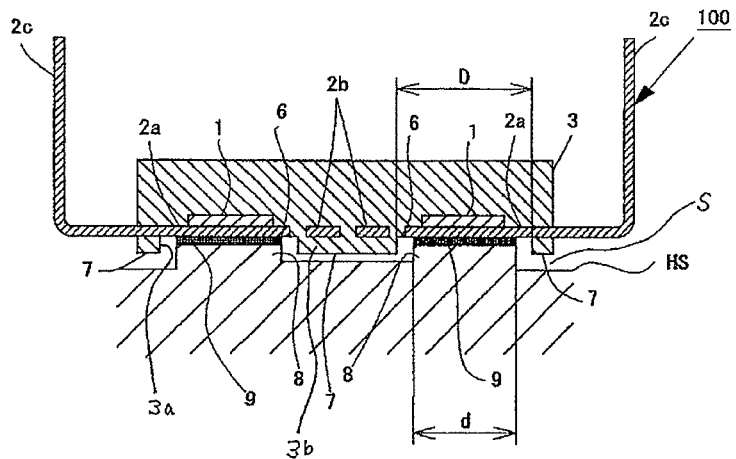
FIG. 3 is a sectional view taken along the line A-A of the power semiconductor module 100 in FIG. 2.

FIG. 1 is a perspective view showing the configuration of the power semiconductor module 100 in Embodiment 1 and also showing the inside by seeing through a resin package 3 shown by a dashed line. FIG. 2 is a perspective view in which the power semiconductor module 100 is seen from another angle. FIG. 3 is a sectional view taken along the line A-A of the power semiconductor module 100 in FIG. 2 and showing a state where the power semiconductor module is attached to a heat sink HS.

As shown in FIG. 1, a resin package 3 made of electrically insulating epoxy resin or the like includes two power semiconductor devices 1, four metal substrates 2 (first metal substrates 2a and second metal substrates 2b), and two leads 5 (5a and 5b); those of which serve as insert members and are integrally formed by the well known transfer molding method to form the power semiconductor module 100; and the lower surface of the power semiconductor module 100 on the heat dissipation surface 7 side is attached to a heat sink HS as to be described later.

Among four metal substrates 2 (first metal substrates 2a and second metal substrates 2b), two first metal substrates 2a having a large area are each mounted with one power semiconductor device 1. The power semiconductor device 1 is a MOSFET chip and has a source electrode 1a and a gate electrode 1b on one surface thereof and a drain electrode (not shown in the drawing) on the opposite surface thereof.

The drain electrode of the power semiconductor device 1 is mechanically and electrically connected to the first metal substrate 2a by a conductive connection member (not shown in the drawing) such as solder and conductive adhesive.

The metal substrates 2 (first metal substrates 2a and second metal substrates 2b) are made of metal having good thermal conductivity and electrical conductivity such as copper alloy and are totally or partially applied with tin plating processing, nickel plating processing, or the like. Furthermore, four metal substrates 2 (first metal substrates 2a and second metal substrates 2b) embedded in the resin package 3 are horizontally arranged in the same planar state as shown in FIG. 3.

Then, in the first metal substrate on which the power semiconductor device 1 is mounted, the back surface on the side opposite to the mounting surface of the power semiconductor device 1 is exposed to the heat dissipation surface 7 of the resin package (to be described in detail by Paragraph No. 0019).

The lead 5a is electrically connected between the respective source electrodes 1a of two power semiconductor devices 1. The lead 5a is connected to the source electrodes 1a by connection member (not shown in the drawing) such as solder. Furthermore, an intermediate portion of the lead 5a is electrically connected to the second metal substrate 2b on which the power semiconductor device 1 is not mounted by a connection member (not shown in the drawing) such as solder. Similarly, the lead 5b is connected between the gate electrodes 1b and an intermediate portion of the lead 5b is electrically connected to another second metal substrate 2b that is different from the second metal substrate 2b to which the lead 5a is connected. Then, two second metal substrates 2b are arranged so as to be sandwiched between two first metal substrates 2a.

That is, two first metal substrates 2a are separately arranged in the resin package 3; and two second metal substrates 2b are arranged between such separated portions in an embedded state.

Incidentally, aluminum wires may be connected in place of the leads 5 (5a and 5b). In the case of the aluminum wire, the well known wire bonding method is used, and the number and wire diameter of the aluminum wire are appropriately selected depending on allowable current.

According to such a configuration, the outer surface of a protruded resin portion 3b of the resin package 3, which covers the second metal substrates 2b, exists between a plurality of the first metal substrates 2a exposed as the heat dissipation surface; and therefore, the distance between metal exposed surfaces can be largely secured. As a result, in a process in which the power semiconductor module 100 is bonded to the heat sink HS (to be described later), a risk that causes short circuit failure can be further reduced in the case where a conductive foreign object is attached across between the first metal substrates 2a (see FIG. 4).

A plurality of external connection terminals 2c are extended from the resin package 3. The external connection terminal 2c is bent upward so as to be led to a place to be connected to an external device terminal (not shown in the drawing). As connecting means, various kinds of welding methods, soldering, fastening by a bolt, and the like may be used.

Furthermore, in this Embodiment 1, the external connection terminals 2c and the first metal substrates 2a and the external connection terminals 2c and the second metal substrates 2b are integrally formed; however, it is possible to use those which have been separately prepared are joined.

Next, a structure in which the back surface of the first metal substrate 2a on the side opposite to the mounting surface of the power semiconductor device is made to expose outside the resin package 3 will be described.

Among four metal substrates 2 (first metal substrates 2a and second metal substrates 2b) horizontally arranged in the same planar state, each of the first metal substrates 2a is configured such that a part of the back surface of the first metal substrate 2a on which the power semiconductor device 1 is mounted on the surface is exposed on the heat dissipation surface 7 side of the resin package 3 in order to configure a heat dissipation surface 6 as shown in FIG. 2. That is, each first metal substrate 2a is placed in a concave portion 3a of a more recessed place (a place where the first metal substrate is embedded) than the heat dissipation surface 7 of the resin package 3 in order that the part 6 of the back surface is made to expose.

On the other hand, the second metal substrates 2b on which the power semiconductor devices 1 are not mounted are located in the protruded resin portion 3b which forms a part of the heat dissipation surface 7a between the concave portions 3a. The second metal substrates 2b are not exposed outside but are located in a state completely embedded in the resin package 3.

Next, the structure of attaching the power semiconductor module 100 to the heat sink HS will be described with reference to FIG. 3.

In FIG. 3, bases 8 are formed on the heat sink HS of the external device to which the power semiconductor module 100 is assembled at two opposite positions corresponding to the heat dissipation surfaces 6 of the metal substrates 2a, respectively; and the upper surfaces of these bases 8 are bonded to the heat dissipation surfaces 6 by electrically insulating bonding members 9.

Although not particularly specified, examples of the bonding member 9 include, for example, silicone adhesive, silicone grease, and epoxy adhesive; and in order to enhance thermal conductivity, filler such as silica and boron nitride is mixed.

According to the attachment structure of the power semiconductor module, the exposed surface of the first metal substrate 2a on which the power semiconductor device 1 that needs heat dissipation is mounted is directly attached to the heat sink HS via the bonding member 9; and therefore, high heat dissipation properties can be obtained. Furthermore, as a result, a heat dissipation area does not need to be enlarged for improving heat dissipation properties and an increase of the heat dissipation area can be suppressed; and consequently, the power semiconductor module 100 can be reduced in size.

Furthermore, the metal substrates 2 other than that serve as internal wirings or the like and a need of heat dissipation is low and therefore protected by being embedded in the electrically insulating resin package. Accordingly, a risk that causes short circuit failure of a circuit can be reduced in the case where a conductive foreign object is trapped by any possibility or in the case where a conductive foreign object is attached across between the metal substrates during a process in which the power semiconductor module 100 is assembled to the heat sink HS.

The electrically insulating bonding member 9 is mixed with particles (not shown in the drawing) of solid material such as plastic having a diameter corresponding to the thickness of the bonding member in order to control the thickness thereof.

The bonding member 9 is applied to the upper surface of the base 8 of the heat sink HS in a liquid state; and the power semiconductor module 100 is attached thereon to be heat-hardened. It is preferable that the power semiconductor module 100 is pressed to the heat sink HS during heat hardening. This extrudes extra adhesive; and therefore, the thickness of the bonding member 9 can be accorded with the diameter of the mixed particles. As for the thickness of the bonding member 9, excessive thickness results in degradation of the heat dissipation properties and excessive thinness results in an increase of the risk of a short circuit between the power semiconductor module 100 and the heat sink HS; and therefore, the thickness of the bonding member 9 is determined by taking whole balance into account.

According to such a structure, the thickness of the bonding member can be controlled by the diameter of the particles; and therefore, damage to heat dissipation properties due to excessive thickness and damage to insulation properties between the power semiconductor module 100 and the heat sink HS due to excessive thinness can be prevented.

Although not particularly specified, metal material such as aluminum alloy may be used as material of the heat sink HS. Incidentally, in order to ensure insulation properties with respect to the power semiconductor module 100, it is preferable that an electrically insulating surface film (not shown in the drawing) is formed on the upper surface and the side surfaces of the base 8 of the heat sink HS and/or the surface facing the power semiconductor module 100. For example, in the case of aluminum alloy, an oxidized film such as alumite may be used. Furthermore, a polymer membrane such as polyimide may be formed.

According to such a structure, even when the heat sink HS made of conductive material such as metal is used, electrical insulation properties can be provided on the surface to which the power semiconductor module 100 is attached.

As described above, the electrical insulation properties are provided on the surface of the heat sink HS to which at least the power semiconductor module 100 is attached; and accordingly, even when a conductive foreign object is trapped by any possibility in the case where the power semiconductor module 100 is assembled to the heat sink HS, a short circuit between the power semiconductor module 100 and the heat sink can be prevented and the risk of short circuit failure of the power semiconductor module 100 can be further reduced.

Incidentally, in the case where the heat sink HS is made of aluminum or aluminum alloy, the same effects can be expected even when the electrical insulation properties are provided on the heat dissipation surface on the power semiconductor module side.

In addition, as shown in FIG. 3, a gap S is provided between the heat sink HS and the heat dissipation surface 7 of the lower surface of the resin package 3 to prevent interference. Furthermore, in order to allow positional deviation in the case of assembling the power semiconductor module 100 to the heat sink HS, the width D of the heat dissipation surface 6 is set to be larger than the width d of the base 8.

Figure 4:
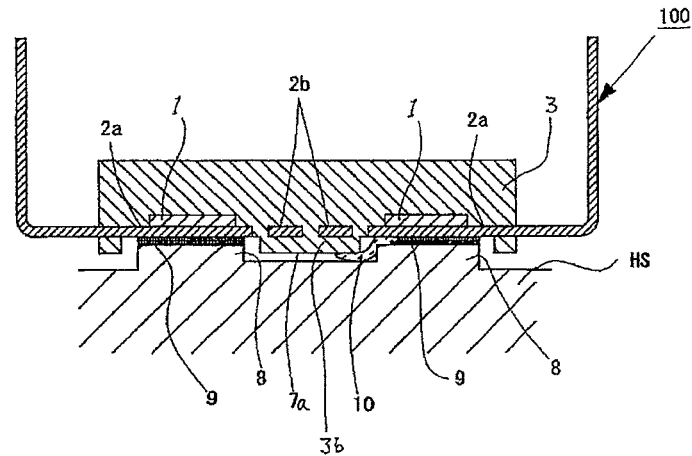
FIG. 4 is a sectional view showing an example of a state where a conductive foreign object 10 is trapped between the power semiconductor module and a heat sink.

Next, FIG. 4 is an example showing a state where a conductive foreign object 10 is trapped.

Waste metal or the like generated from a manufacturing apparatus, the metal substrate 2, solder, and the like is concerned as the conductive foreign object 10. One end of the conductive foreign object 10 comes in contact with the metal substrate 2a and the other end thereof reaches the heat dissipation surface 7a of the lower surface of the resin package beneath the metal substrate 2b. If the second metal substrates 2b are exposed to the heat dissipation surface 7, the conductive foreign object 10 makes the metal substrates 2a and 2b short-circuit. However, the second metal substrates 2b are covered with resin of the resin package 3 serving as an insulating member; and therefore, the metal substrates 2a and 2b are not short-circuited. Furthermore, the second metal substrates 2b embedded in the resin package 3 are arranged so as to be sandwiched between the first metal substrates 2a in which the heat dissipation surfaces 6 are exposed; and therefore, the distance between two first metal substrates 2a in which the heat dissipation surfaces 6 are exposed is sufficiently secured. Consequently, unless the conductive foreign object is extremely large, a short circuit is not formed between the first metal substrates 2a. Furthermore, an insulation film is formed on the surface of the heat sink HS to which the power semiconductor module 100 is attached; and therefore, a short circuit of a circuit can be prevented even when a conductive foreign object is trapped between the power semiconductor module 100 and the heat sink HS.

Embodiment 2

Figure 5:
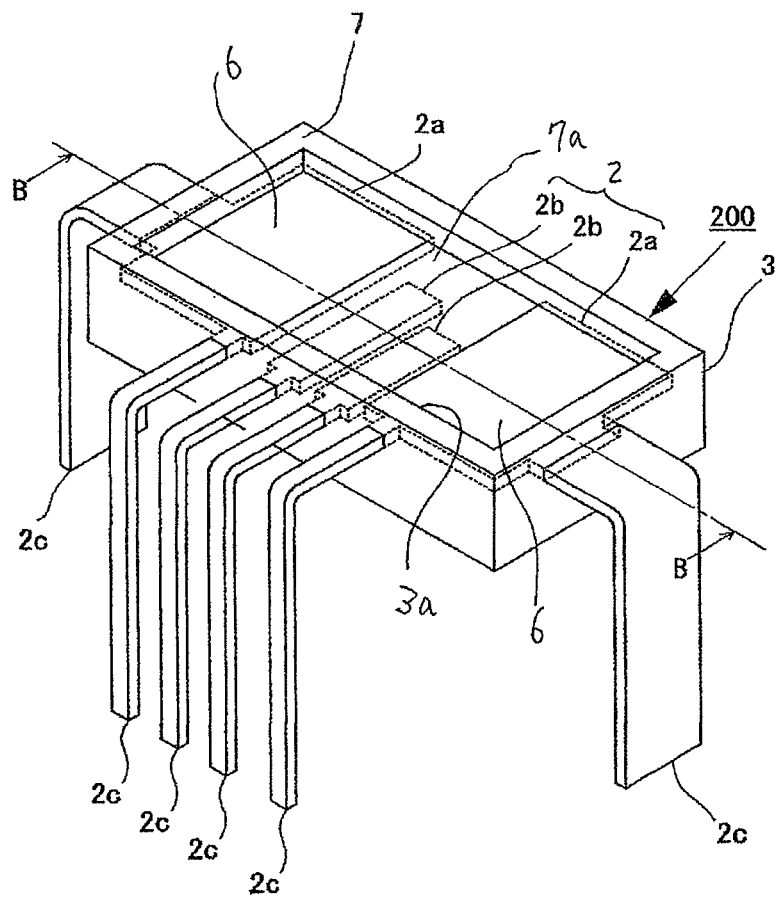
FIG. 5 is a perspective view showing the configuration of a power semiconductor module 200 in Embodiment 2 of the present invention.
Figure 6:
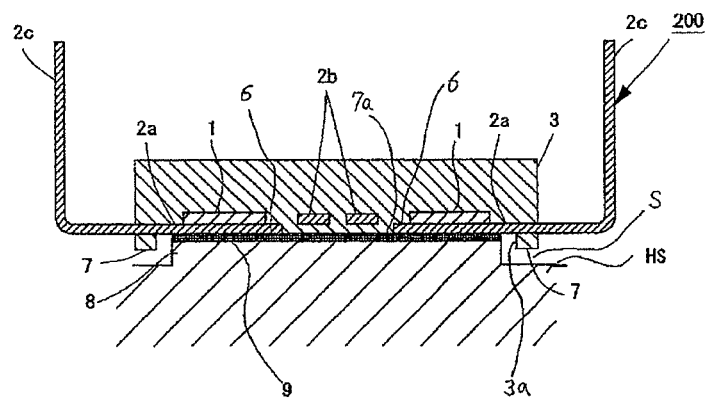
FIG. 6 is a sectional view taken along the line B-B of the power semiconductor module 200 in FIG. 5.

FIG. 5 is a perspective view showing the configuration of a power semiconductor module 200 in Embodiment 2 of the present invention; and FIG. 6 is a sectional view taken along the line B-B in FIG. 5 of the power semiconductor module 200 and showing a state where the power semiconductor module 200 is attached to a heat sink HS. Incidentally, the same reference numerals are given to constituent elements corresponding to the constituent elements of Embodiment 1 shown in FIG. 1 to FIG. 4.

In the power semiconductor module 200 of Embodiment 2, the internal structure of a resin package 3 is basically the same as the power semiconductor module 100 of Embodiment 1; however, the power semiconductor module 200 differs in that second metal substrates 2b on which power semiconductor devices 1 are not mounted are arranged at a lower level with respect to first metal substrates 2a on which the power semiconductor devices 1 are mounted.

That is, the first metal substrates 2a and the second metal substrates 2b are arranged in different levels by shifting the second metal substrates 2b one step from the first metal substrates 2a; accordingly, the heat dissipation surface 7a of the resin package 3 that covers the second metal substrates 2b has an outer surface placed on the same planar surface as the exposed surfaces of the first metal substrates 2a (the back surface on the opposite side of the first metal substrate) and respective surfaces of both substrates are aligned in the same planar surface to form one area communicated with the heat dissipation surfaces 6. For this reason, a base 8 of the heat sink HS corresponding to the heat dissipation surfaces 6 is also one base.

According to this Embodiment 2, in addition to the effects described in Embodiment 1, the base 8 of the heat sink HS is one base and the shape thereof is simple; and therefore, the process of the heat sink HS is easy. Furthermore, the heat dissipation surface 6 is formed as one area; and therefore, an area bonded to the base 8 can be larger as compared to the configuration of Embodiment 1 whose heat dissipation surface is divided into a plurality of areas and thus heat dissipation properties can be further enhanced. This is apparent from the comparison between FIG. 3 and FIG. 6. In addition, an electrically insulating bonding member 9 is filled between the exposed first metal substrates 2a; and therefore, a risk in which a conductive foreign object enters and is attached across between the metal substrates during use can be further reduced and thus short circuit failure is prevented.

Further, according to such a configuration, the heat dissipation surface 7a of a resin portion of the resin package that covers the second metal substrates 2b has the outer surface placed on the same planar surface as the exposed surfaces of the first metal substrates to form one heat dissipation surface, one surface can be formed without a need of forming the concavity and convexity on a heat sink bonding surface as shown in FIG. 3, and the base of the heat sink can be one base; and therefore, not only the shape of the heat sink HS can be simplified, but also loss of the bonding area due to the concavity and convexity can be eliminated and thus the heat dissipation properties can be further improved. In addition, the electrically insulating bonding member is filled between the exposed first metal substrates 2a; and therefore, a risk in which a conductive foreign object enters and is attached across between the first metal substrates 2a during use can be further reduced and thus short circuit failure can be prevented.

Incidentally, in the case where at least one of the second metal substrates 2b is located in different levels with respect to the first metal substrates 2a and the other of the second metal substrates 2b is not located in different levels, even when a protruded resin portion as shown in FIG. 3 is provided for the second metal substrate 2b, the height of the lower surface of a resin package due to the protruded resin portion can be lowered. This allows to reduce the concavity and convexity of the bonding surface of the heat sink HS to which the power semiconductor module is bonded and to simplify the shape. As a result, for example, cutting work is easy in the case where the bonding surface of the heat sink is finished by cutting.

Figure 7:
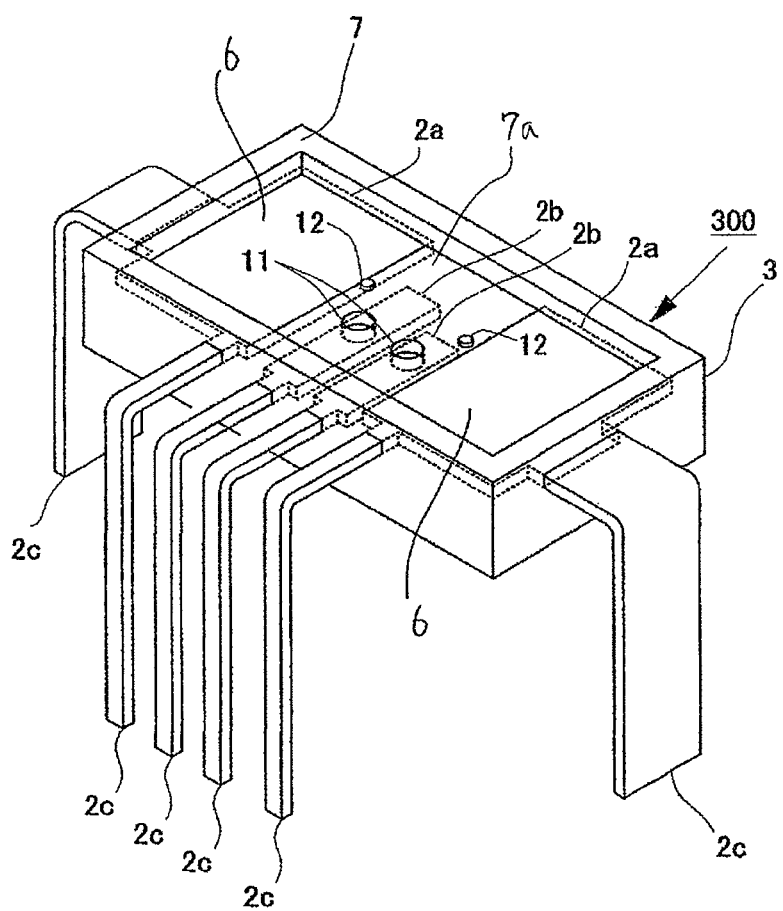
FIG. 7 is a perspective view showing the configuration of a power semiconductor module 300 that is a modified embodiment of Embodiment 2 of the present invention.

FIG. 7 is a perspective view showing a power semiconductor module 300 that is a modified embodiment of Embodiment 2.

Pinholes 11 reaching second metal substrates 2b are formed in a heat dissipation surface 7a of this modified embodiment.

Therefore, the second metal substrate 2b is partly exposed from a resin package 3 at the position of the pinhole 11. The pinhole 11 is formed; and accordingly, the second metal substrate 2b can be supported by a supporting pin (not shown in the drawing) in a transfer molding process during manufacturing of the power semiconductor module 300 (in other words, the pinhole 11 can be remained as an impression of the supporting pin).

Furthermore, the second metal substrate 2b can be prevented from being deformed by the injection pressure of resin of the resin package 3.

In addition, an exposed portion of the second metal substrate 2b corresponding to the pinhole 11 is utilized as a probing electrode; and accordingly, electrical characteristic inspection of the power semiconductor module 300 can be performed.

As described above, all the second metal substrates 2b on which power semiconductor devices 1 are not mounted do not necessarily need to be embedded inside the resin package 3. Even when a part of the second metal substrate 2b is exposed, if most of the second metal substrate 2b is embedded inside the resin package 3, an effect of preventing a short circuit of a circuit with respect to a trap of a conductive foreign object can be expected.

Furthermore, a plurality of protrusions 12 made of resin of the resin package 3 are formed on the heat dissipation surface 7a of this modified embodiment. The protrusions 12 are provided for controlling the thickness of a bonding member 9 in the case of assembling the power semiconductor module 300 to a heat sink HS. That is, the thickness of the bonding member 9 is controlled by the height of the protrusions 12, and the same effects as the particles described in Embodiment 1 can be obtained.

According to such a configuration, the thickness of the bonding member 9 can be controlled by the height of the protrusions 12; and therefore, damage to heat dissipation properties due to excessive thickness and damage to insulation properties between the power semiconductor module 300 and the heat sink HS due to excessive thinness can be prevented.

Incidentally, the protrusions 12 may be provided on the attachment surface side of the heat sink HS to which the power semiconductor module 300 is attached.

Figure 8:
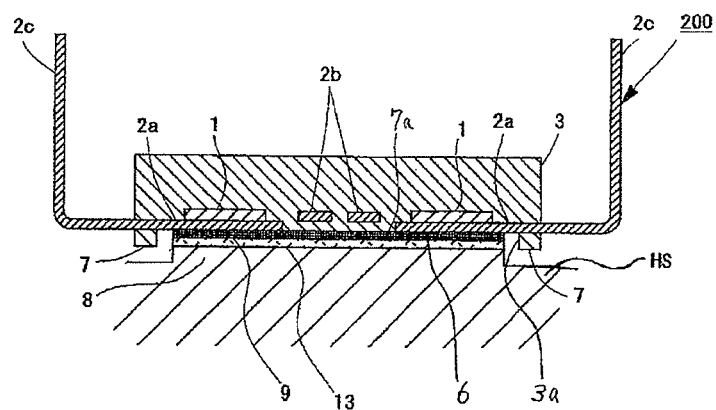
FIG. 8 is a sectional view showing a modified embodiment of a state where the power semiconductor module 200 in Embodiment 2 is attached to a heat sink HS.

FIG. 8 is a sectional view showing a modified embodiment in a state where a power semiconductor module 200 of Embodiment 2 is attached to a heat sink HS.

In FIG. 8, an insulation plate 13 such as an electrically insulating plate or sheet member is stuck to the upper surface of a base 8 of the heat sink HS made of metal such as aluminum alloy via adhesive or grease or the like (not shown in the drawing) in order to provide electrical insulation properties.

The semiconductor module 200 is attached on the insulation plate 13 via a bonding member 9. Although not particularly specified, ceramic is desirable as material of the insulation plate 13 because an electrically insulating material with good thermal conductivity is preferable. Among the material, especially, silicon nitride or aluminum nitride with a high coefficient of thermal conductivity is desirable. Alternatively, one made of plastic may be permissible. Furthermore, the insulation plate 13 does not need to be rigid, but a flexible sheet shape or film shape may be permissible.

In this attachment structure, even when the thickness of the bonding member 9 is excessively thin, there is no concern that the module is short-circuited to the heat sink HS; and therefore, the protrusions 12 or the like that control the thickness do not need to be provided.

According to such a configuration, insulation between the power semiconductor module 200 and the heat sink can be secured without forming an insulation film on the heat sink HS. Furthermore, the thickness can be relatively easily provided as compared to the insulation film; and therefore, insulation properties can be more securely obtained.

Other Embodiment

The aforementioned respective embodiments are merely exemplifications of the embodiments of the present invention, and alterations may be appropriately made or Embodiment 1 and Embodiment 2 may be combined without departing from the spirit or scope of the present invention.

Furthermore, the aforementioned respective embodiments are a relay circuit using a MOSFET device as the power semiconductor device; however, a power semiconductor module having a different circuit function may be permissible. For example, a three phase bridge inverter circuit for a three phase rotary machine may be permissible, and a power semiconductor module that constitutes a part of an inverter circuit may be permissible.

Further, examples of the semiconductor device are not limited to the power MOSFET device, but a power semiconductor device such as an insulated gate bipolar transistor (IGBT) device may be permissible.

In addition, elements to be arranged in the module are not limited to only the power semiconductor device, but a logic based semiconductor device, a chip capacitor element, a resistance element may be simultaneously arranged and embedded in the resin package.

Besides, the power semiconductor modules described in the aforementioned embodiments are suitable for those which are used by being incorporated in a vehicular rotary electric machine.

The power semiconductor modules according to the aforementioned respective embodiments are a small size and therefore can contribute to reduction in size of a rotary electric machine to be mounted in a limited space like an automobile.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A power semiconductor module comprising:
a first metal substrate on which a power semiconductor device is mounted;
a second metal substrate on which a power semiconductor device is not mounted; and
an electrically insulating resin package which seals said first metal substrate and said second metal substrate,
wherein a back surface of said first metal substrate on a side opposite to a mounting surface of said power semiconductor device is made to expose outside said resin package to form a heat dissipation surface.

2. The power semiconductor module according to claim 1, wherein two types of said metal substrates are horizontally arranged in a same planar state in said resin package and a concave portion is formed in said resin package at a place where said first metal substrate is embedded, whereby the back surface on the opposite side of said first metal substrate is made to expose outside said resin package to form the heat dissipation surface.

3. The power semiconductor module according to claim 1, wherein two types of said metal substrates are arranged in different levels by being shifted in said resin package, whereby the back surface on an opposite side of said first metal substrate is made to expose outside said resin package to form the heat dissipation surface.

4. The power semiconductor module according to claim 3, wherein the exposed surface of said first metal substrate and an outside surface of said resin package except for the exposed surface are aligned in a same planar surface, and the same planar surface portion serves as the heat dissipation surface coming in contact with a heat sink.

5. The power semiconductor module according to claims 1, wherein a plurality of said first metal substrates are separately arranged in said resin package, and said second metal substrate is located in an embedded state between the separated portions.

6. An attachment structure of a power semiconductor module in which the heat dissipation surface of the power semiconductor module as set forth in claim 1 is attached to a base surface formed on a heat sink via an electrically insulating bonding member.

7. The attachment structure of the power semiconductor module according to claim 6,
wherein said electrically insulating bonding member is mixed with particles of solid material each having a diameter corresponding to a thickness of said bonding member.

8. The attachment structure of the power semiconductor module according to claim 6, wherein the heat dissipation surface of said power semiconductor module or an attachment surface of said heat sink to which said power semiconductor module is mounted is provided with protrusions that control the thickness of said electrically insulating bonding member.

9. The attachment structure of the power semiconductor module according to claim 7,
wherein the heat dissipation surface of said power semiconductor module or the attachment surface of said heat sink to which said power semiconductor module is mounted is provided with protrusions that control the thickness of said electrically insulating bonding member.

10. The attachment structure of the power semiconductor module according to claim 6,
wherein the heat dissipation surface of said power semiconductor module that covers said second metal substrate is formed with a hole reaching said second metal substrate.

11. The attachment structure of the power semiconductor module according to claim 7,
wherein the heat dissipation surface of said power semiconductor module that covers said second metal substrate is formed with a hole reaching said second metal substrate.

12. The attachment structure of the power semiconductor module according to claim 6,
wherein the attachment surface of said heat sink to which said power semiconductor module is attached is stuck with an electrically insulating plate or sheet member.

13. The attachment structure of the power semiconductor module according to claim 6,
wherein the heat dissipation surface of said power semiconductor module or the attachment surface of said heat sink to which said power semiconductor module is attached is formed with an electrically insulating material film.

14. The attachment structure of the power semiconductor module according to claim 13,
wherein said heat sink is made of aluminum or aluminum alloy, and the electrically insulating film is formed by an oxidized film.

* * * * *